(12) United States Patent
Schleiminger

(10) Patent No.: US 10,807,228 B2
(45) Date of Patent: Oct. 20, 2020

(54) HAND TOOL

(71) Applicant: KNIPEX—Werk C. Gustav Putsch KG, Wuppertal (DE)

(72) Inventor: Jan Schleiminger, Solingen (DE)

(73) Assignee: KNIPEX-Werk C. Gustave Putsch KG, Wuppertal (DE)

( * ) Notice: Subject to any disclaimer, the term of this patent is extended or adjusted under 35 U.S.C. 154(b) by 289 days.

(21) Appl. No.: 16/073,841

(22) PCT Filed: Jan. 23, 2017

(86) PCT No.: PCT/EP2017/051315
§ 371 (c)(1),
(2) Date: Jul. 30, 2018

(87) PCT Pub. No.: WO2017/133914
PCT Pub. Date: Aug. 10, 2017

(65) Prior Publication Data
US 2019/0039230 A1    Feb. 7, 2019

(30) Foreign Application Priority Data
Feb. 4, 2016   (DE) .......................... 10 2016 101 925

(51) Int. Cl.
*B25G 1/10* (2006.01)
*B25B 7/00* (2006.01)
(Continued)

(52) U.S. Cl.
CPC .................. *B25G 1/10* (2013.01); *B25B 7/00* (2013.01); *B25B 7/22* (2013.01); *B25B 23/16* (2013.01);
(Continued)

(58) Field of Classification Search
CPC .... B25G 1/01; B25G 1/10; B25B 7/00; B25B 7/22; B25B 23/16; B26B 13/12
See application file for complete search history.

(56) References Cited

U.S. PATENT DOCUMENTS 6,270,134 B1    8/2001 Lin
7,055,414 B2 *  6/2006 Konen ...................... B25B 7/00
                                                        267/166
(Continued)

FOREIGN PATENT DOCUMENTS

DE     201 20 379 U1    4/2002
EP      2 179 820 A1    4/2010

OTHER PUBLICATIONS

International Search Report of PCT/EP2017/051315, dated Apr. 26, 2017.

*Primary Examiner* — David B. Thomas
(74) *Attorney, Agent, or Firm* — Collard & Roe, P.C.

(57) ABSTRACT

A hand tool comprising two tool halves arranged crossing one another in a joint region, like tongs or scissors, wherein a tool half forms a working region on one side of the joint region and a handle region on the other side, wherein each handle region is arranged in a first or second handle sleeve and the handle sleeve is provided with a functional part projecting in relation to a flat surface extending over a substantial portion of the surface of the handle sleeve. In order to advantageously further improve a hand tool of this type, the functional part is adhered or welded to the first and/or second handle sleeve.

10 Claims, 12 Drawing Sheets

(51) Int. Cl.
 *B25G 1/01* (2006.01)
 *B25B 7/22* (2006.01)
 *B25B 23/16* (2006.01)
 *B26B 13/12* (2006.01)
 *G01R 19/00* (2006.01)

(52) U.S. Cl.
 CPC ................ *B25G 1/01* (2013.01); *B26B 13/12* (2013.01); *G01R 19/0084* (2013.01)

(56) References Cited

U.S. PATENT DOCUMENTS 7,100,481 B2 * 9/2006 Hartranft .................. B25B 7/00
 81/417
2005/0081687 A1 4/2005 Konen

* cited by examiner

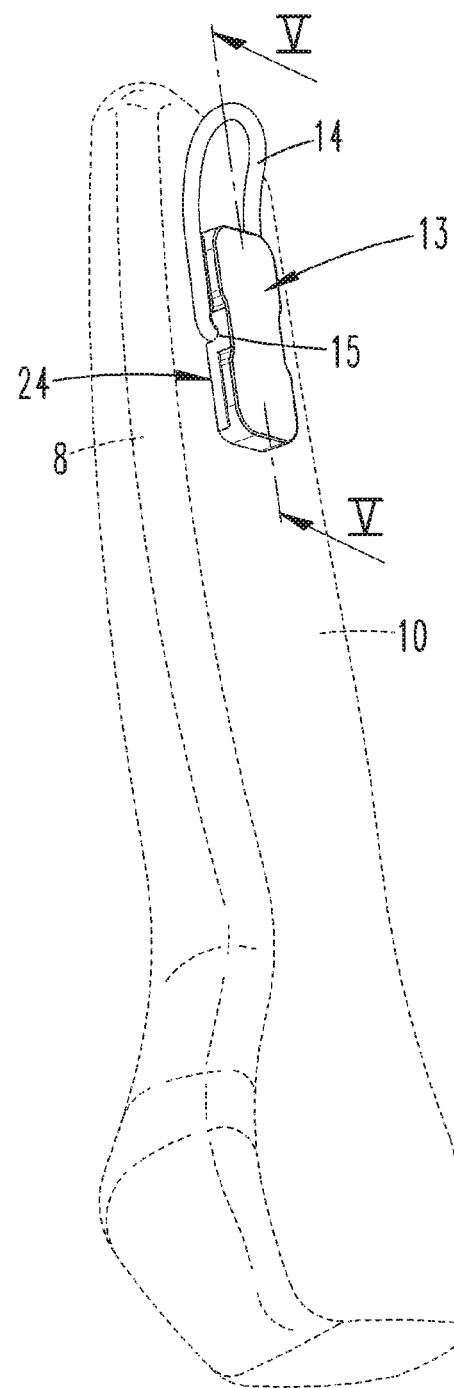

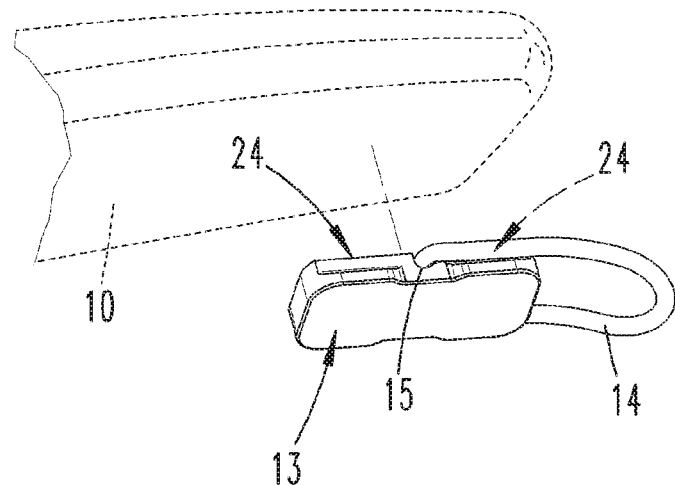
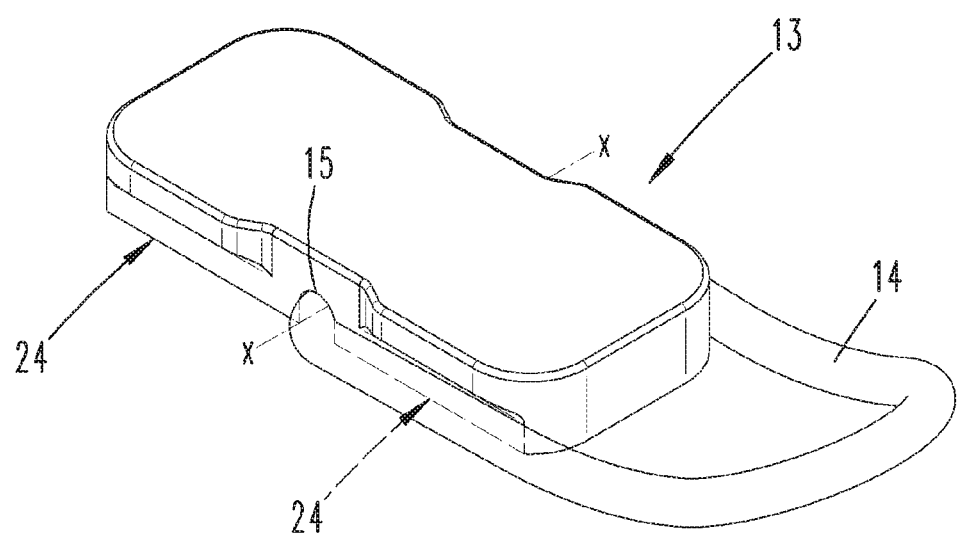

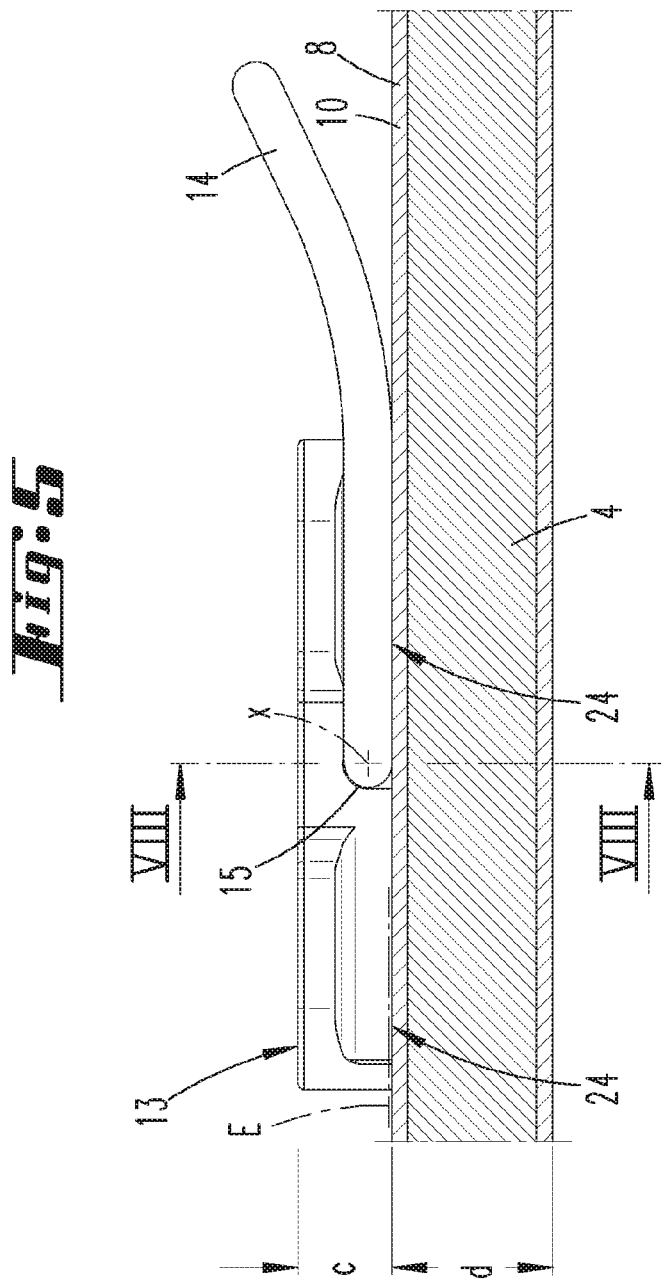

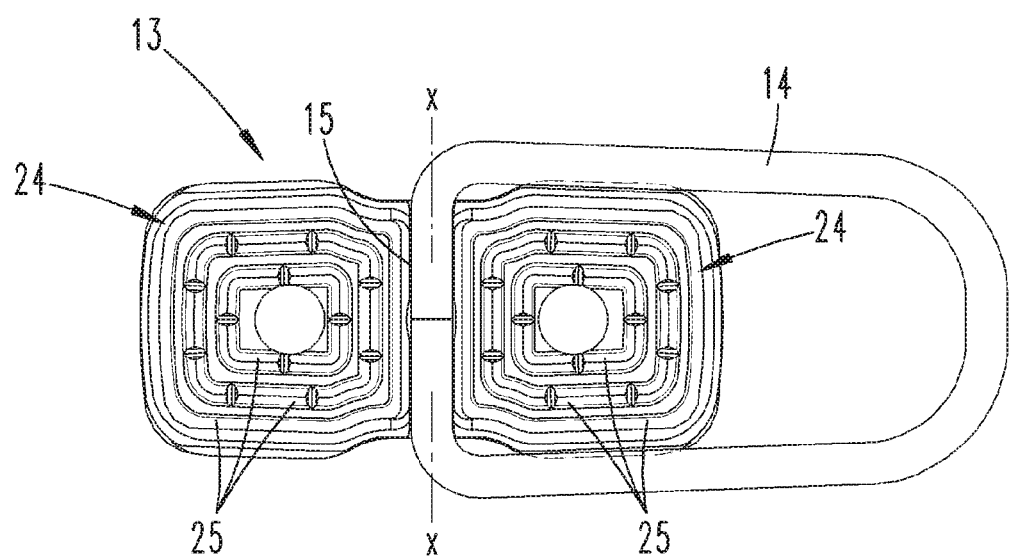

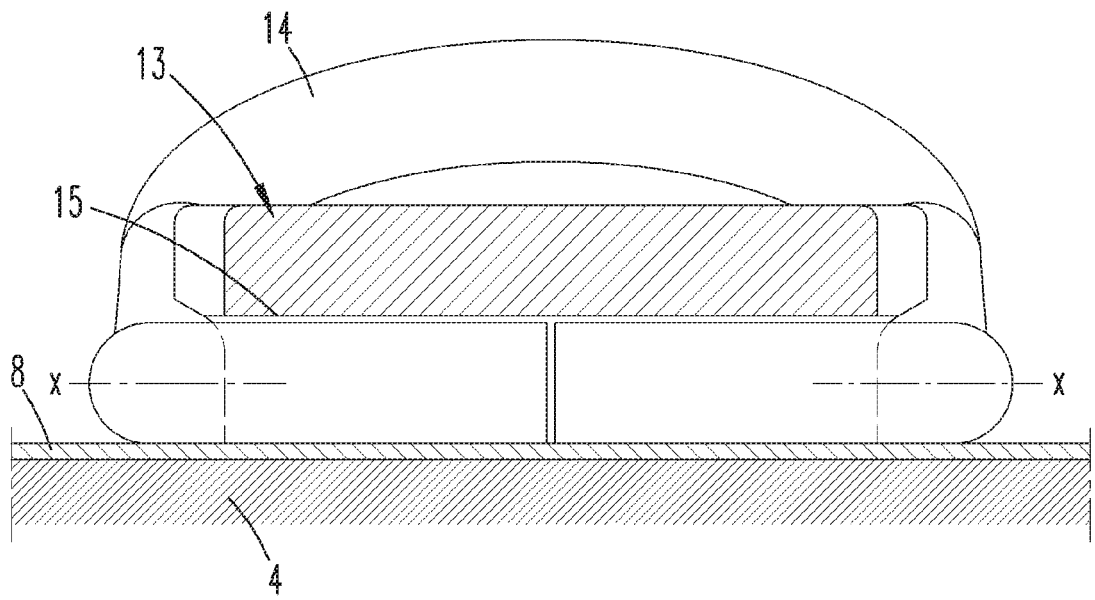
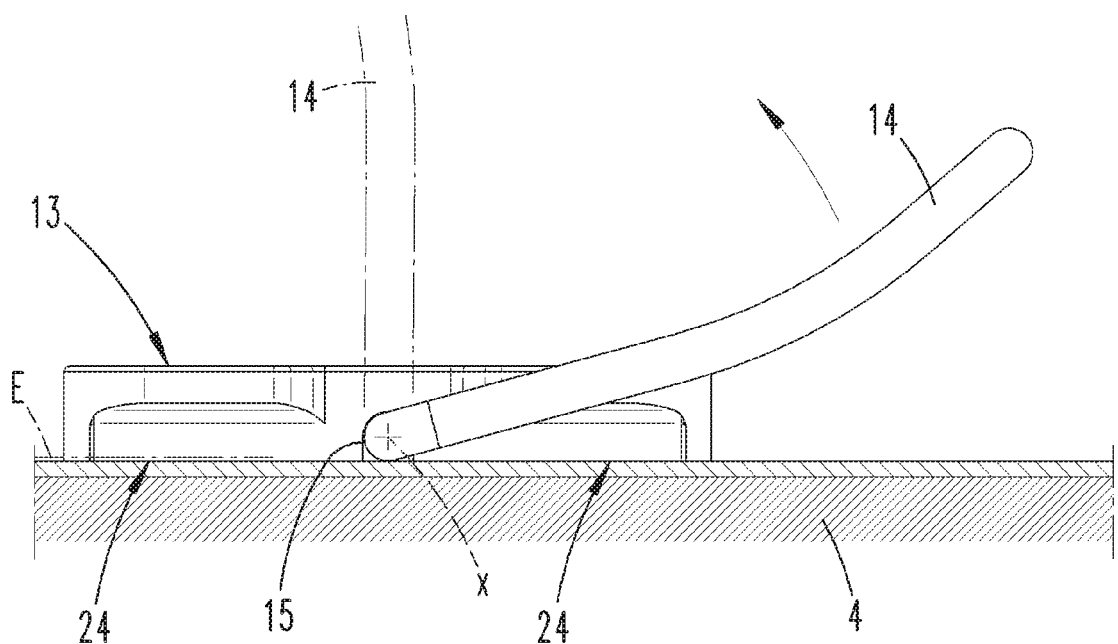

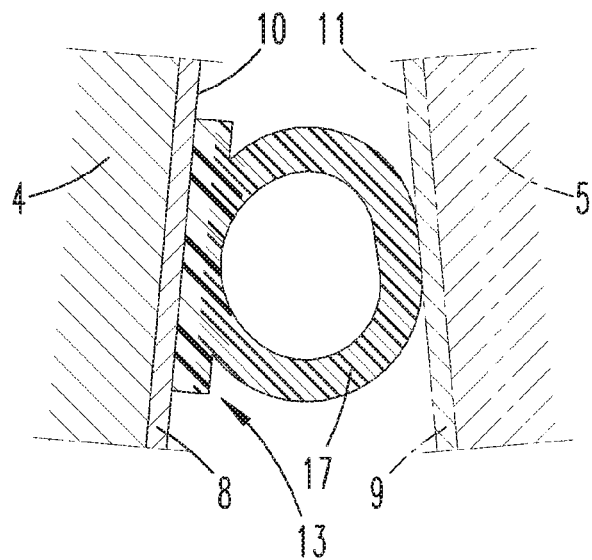
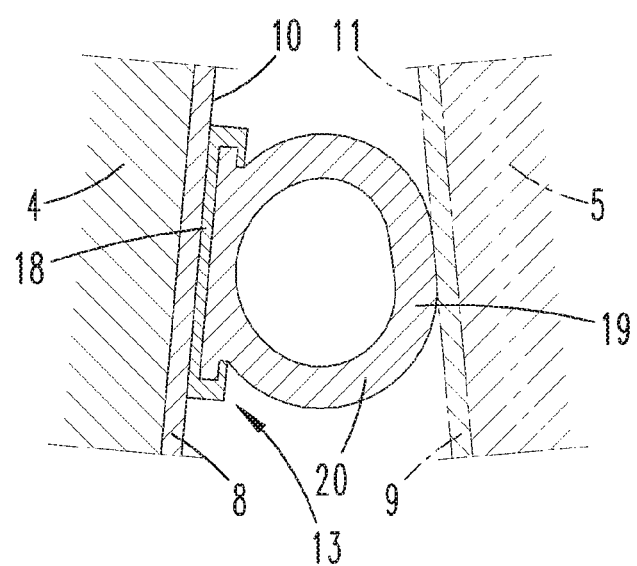

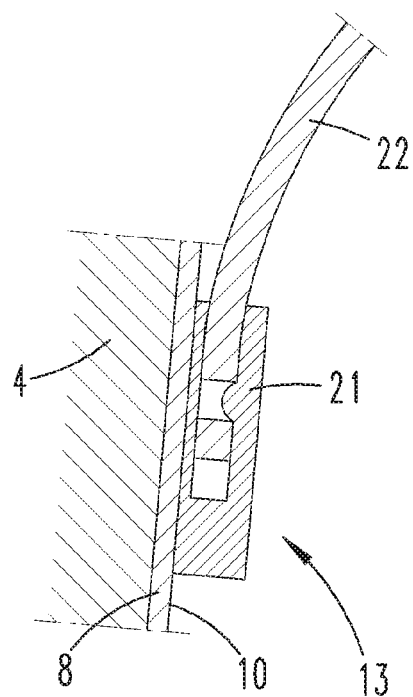

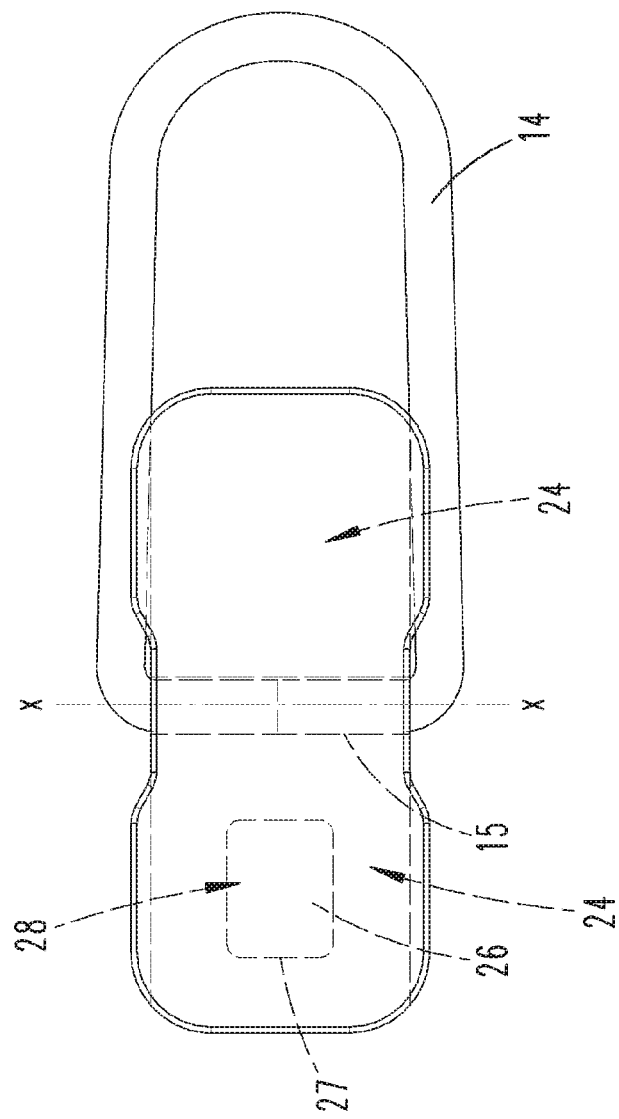

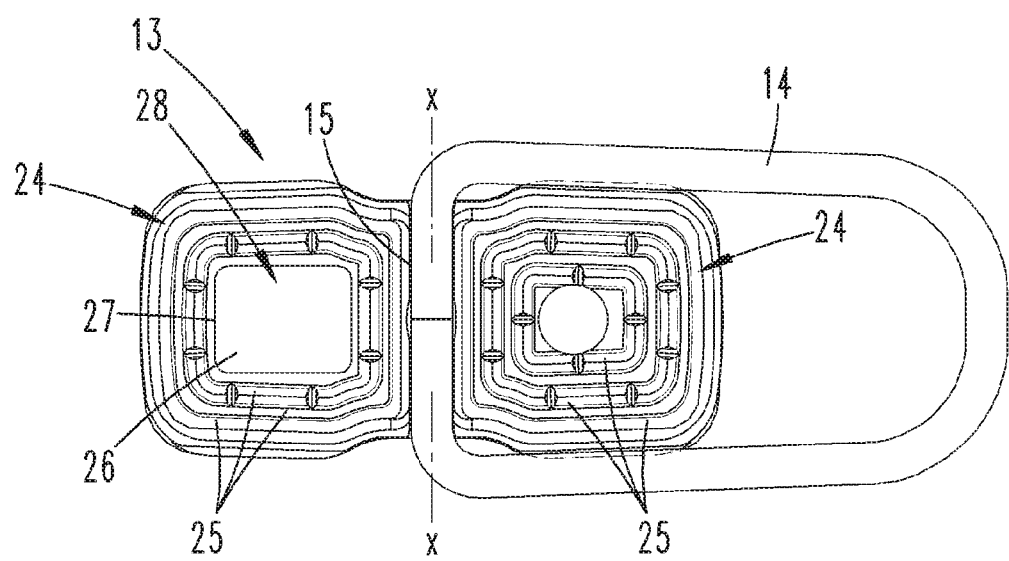

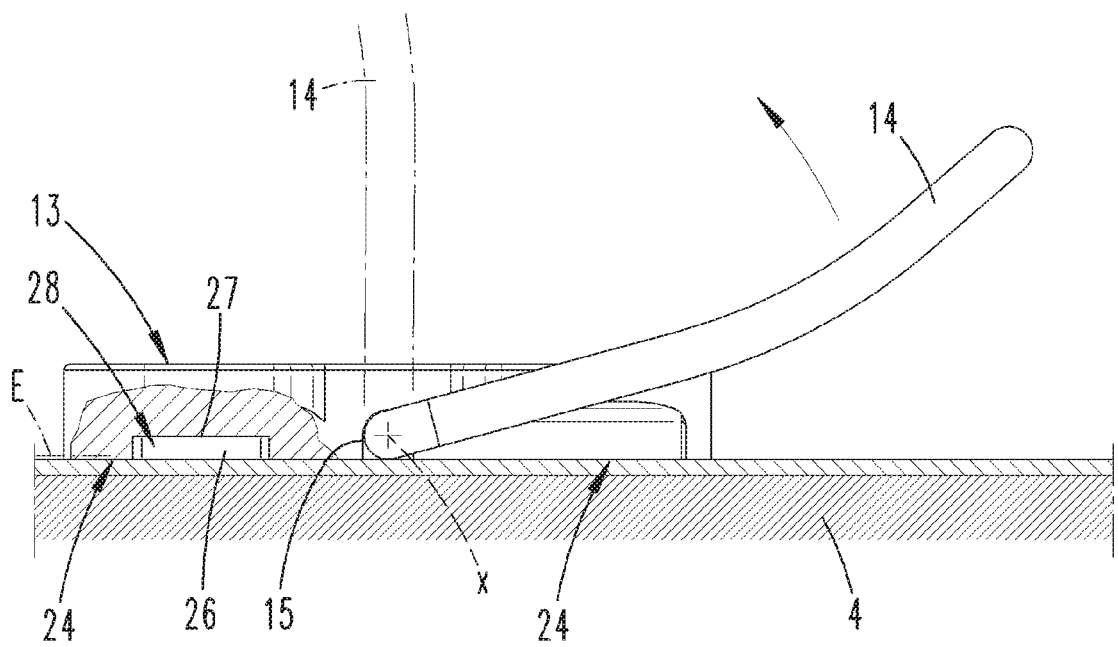
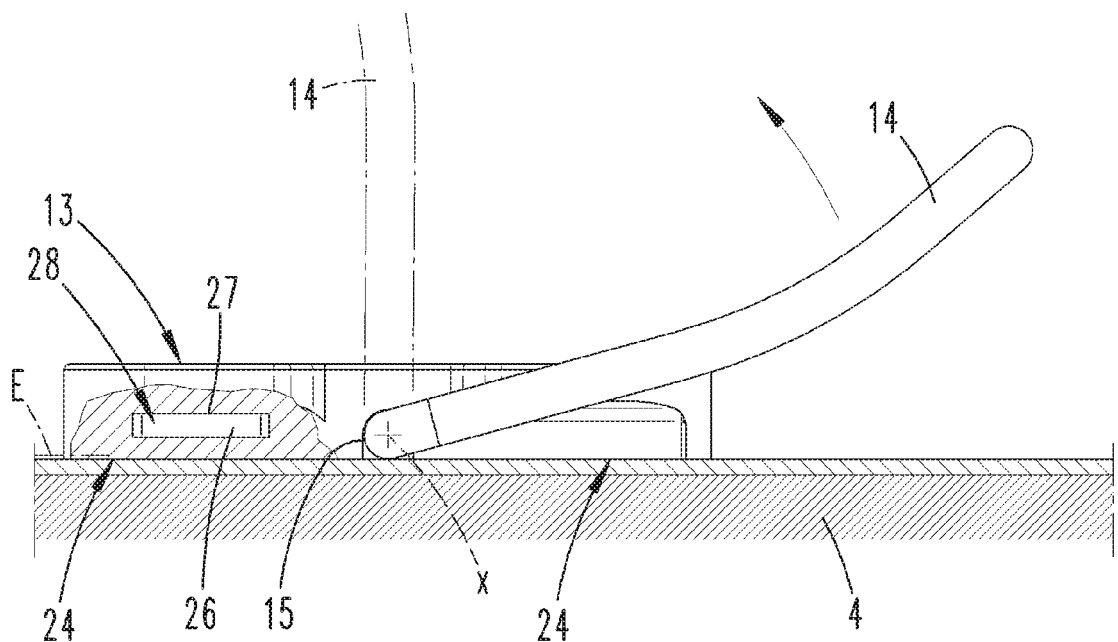

HAND TOOL

CROSS REFERENCE TO RELATED APPLICATIONS

This application is the National Stage of PCT/EP2017/051315 filed on Jan. 23, 2017, which claims priority under 35 U.S.C. § 119 of German Application No. 10 2016 101 925.9 filed on Feb. 4, 2016, the disclosures of which are incorporated by reference. The international application under PCT article 21(2) was not published in English.

TECHNICAL FIELD

The invention relates to a hand tool comprising two tool halves arranged crossing one another in a joint region, such as tongs or scissors, wherein a tool half forms a working region on one side of the joint region and a handle region on the other side, wherein, furthermore, each handle region is arranged in a first or second handle sleeve and the handle sleeve is provided with a functional part projecting in relation to a flat surface extending over a substantial portion of the surface of the handle sleeve.

PRIOR ART

Hand tools of the kind in question are known, e.g. in the form of pliers, such as combination pliers, side cutters or water pump pliers, but also in the form of scissors, as well as, e.g., household shears or garden shears. The handle regions are provided with handle sleeves. Usually, these are plastic handle sleeves, and furthermore such handle sleeves that can be produced using the plastic injection molding process. In this regard, hand tools are known of which the handle sleeves are produced separately, in particular injection-molded, and thereafter are pushed over the handle regions. Also, solutions are known in this regard in which an immediate overmolding of the handle regions is carried out. Moreover, handle sleeves manufactured using the two-component injection molding process are known which accordingly have soft and hard plastic zones beneficial in terms of gripping. The handle sleeves can also be applied onto the handle regions by a dipping process.

It is further known to provide a handle sleeve—and thus the hand tool as a whole—with a functional part. The latter projects beyond the actual surface of the handle sleeve. Known in this respect is the arrangement of the functional part in a region of the handle sleeve, in which a substantial portion of the surface of the handle sleeve extends in a flat surface. Accordingly, such a flat surface has preferably no protruding and recessed elevations or depressions, wherein, however, such a flat surface can definitely extend slightly curved with an accordingly large radius of curvature which is larger than 25 or 50 mm, for example. The substantial portion of the surface of the handle sleeve corresponds to about a quarter to a third of the entire surface of the handle sleeve, in particular as viewed from the free end of the handle.

Known formations provide an integral configuration of handle sleeve and functional part.

SUMMARY OF THE INVENTION

With regard to the known prior art, a technical problem of the invention is seen in further improving a hand tool of the kind in question in an advantageous manner.

A substantial solution to the object according to a first inventive idea is given with a hand tool, with which it is intended that the functional part is adhered or welded to the first and/or second handle sleeve.

Due to the proposed kind of fixing the functional part on the one handle sleeve, a particularly favorable production is achieved. The handle sleeve and functional part are preferably produced separately. If needed, a handle sleeve is fixed with a corresponding functional part to the handle sleeve in the position provided for this purpose.

Moreover, due to the proposed invention, the functional part is independent of the selected handle sleeve material in terms of material (degree of hardness) and/or color, taking into account the type of fixing (adhering or welding). Thus, the functional part can have a hardness that is preferably greater or also lower than the handle sleeve material, in particular in the fixing region. Thus, the handle sleeve material can have, for example, a hardness of 80 to 90 Shore A in the fixing region of the functional part and the material of the functional part can have a hardness of 60 to 70 Shore D, for example. A hardness of the functional part material can be about 10 to 20 Shore degrees or more higher than the hardness of the handle sleeve material.

Fixing the functional part to the handle sleeve can be carried out by adhesive bonding and also by welding, in particular by ultrasonic welding. A type of fixing may be preferred that cannot be released in a non-destructive manner.

It may be that only one handle sleeve is provided with such a functional part. Furthermore, a plurality of functional parts can be provided on the inside and/or outside of a handle sleeve. Moreover, hand tools are possible, the two handles sleeves of which are provided with one or more functional parts.

The functional part can take up or cover about an eighth to a twentieth of the substantial portion of the surface of the handle sleeve.

Further features of the invention are explained below, also in the description of the figures, often in their preferred association with the subject matter of claim 1 or with features of further claims. However, they may also be of importance in association with only individual features of claim 1 or the respective further claim or in each case independently.

Thus, the functional part can be arranged on the inner surface of the first and/or second handle sleeve facing the inner surface of the opposite second and/or first handle sleeve. Accordingly, a positioning of the functional part can be selected which neither affects the possibility of displacing the tool halves nor interferes with the user when operating the hand tool. Rather, a position is found which preferably lies outside of the gripping and acting region of the user.

Also, the functional part can have a connection region formed for connecting to the first and/or second handle sleeve, which connection region is formed as a flat surface or structured in a rib- or nub-like manner. A flat surface, in particular adapted to the surface progression of the handle sleeve in the connection region, thus optionally also a surface of the connection region that is curved, is particularly suitable for adhesive bonding. For welding, in particular in the case of ultrasonic welding, a rib- or nub-like structuring of the flat side of the connection region facing the surface of the handle sleeve is useful, so that a spot-shaped or linear weld connection can be achieved.

In the case of a rib-like structuring, as further preferred, at least one circumferentially closed rib may be formed with reference to a top view of the surface of the connection region facing the surface of the handle sleeve for fixing. As further preferred, the circumferential rib progression can be adapted to the plan view of the connection region.

In a further configuration, several such circumferentially closed ribs may be provided in the connection region, in particular in the form of circumferentially closed ribs that are arranged concentrically.

In a possible configuration, two connection regions can be formed separately in the longitudinal direction of a handle sleeve. As further preferred, these connection regions can be connected to each other. As a result, only one functional part has two separate regions for connecting to the handle sleeve. Preferably, the connection is carried out by adhesive bonding or welding over both connection regions. However, depending on the function of the functional part, only one of the connection regions may be used for fixing.

Overall, the functional part can have an elongated, cuboid shape. Thus, in one embodiment, the two connection regions can each have approximately square plan views which complement each other to form an overall elongated rectangular plan view.

The functional part can have a thickness that protrudes beyond the flat surface of the surface of the handle sleeve—measured transversely to the longitudinal extent of the handle region—which corresponds to one tenth to two thirds of the thickness dimension of the handle region in the region of the functional part that is otherwise closed by the handle sleeve. Thus, with an exemplary thickness of the handle region encompassed by the handle sleeve of 12 to 15 mm, a thickness of the functional part can be 2 to 4 mm.

The functional part can be formed as a drop protection, e.g. with an eyelet or the like for attaching the hand tool to a belt or the like, for example. Also, the functional part can be a spring receptacle, e.g. for a plugged accommodation of a free end of a leaf spring to return the hand tool to a predetermined basic position. Moreover, the functional part can be formed directly as a spring, e.g. as a return spring for the hand tool. In another possible configuration, the functional part is a bracket holder. Such a bracket can be an appropriately shaped wire bracket which, furthermore, can be held between the two connection regions between the functional part and the handle sleeve, optionally in a pivotable manner. Due to the initially loose functional part, such a bracket can be formed in a virtually endless manner, e.g. a wire bracket with the ends welded together. Moreover, the functional part can also form a receptacle for a suspension hook or the like.

In a further configuration, the functional part can form a receptacle or holder for a technical part. Such a technical part can be e.g. a measuring or test part, further e.g. a voltage tester or a measuring tool. Also, the technical part can be used to accommodate and/or hold an electrical or electronic component, e.g. an accumulator or comparable energy storage.

In a possible configuration, the technical part is a transponder, e.g. an RFID transponder. The latter can include an electronic chip, e.g. memory chip for recording events or can be coupled thereto in or on the functional part. The transponder can have its own power supply.

The technical part can be completely accommodated in the functional part, e.g. when producing the functional part using the plastic injection molding process by overmolding the technical part.

Also, the technical part can be placed in a pocket-like recess in the functional part, for example. This recess can be closed with a lid, wherein the lid can also be formed solely by the facing surface of the pliers handle or the handle sleeve. A chamber can be formed in the functional part to accommodate the technical part. Further, several chambers to accommodate a plurality of technical parts or a subdivision of the recess can be provided.

In addition, the functional part can form an adapter for a slide-on or snap-on part. The adapter-like functional part can have a basic shape that can be equipped with slide-on or snap-on parts of various functions. The slide-on or snap-on part can have, for example, one of the functions described above, which are also directly given by the functional part.

The slide-on or snap-on part can be fixed to the functional part at the adapter after it has been engaged thereon in such a way that it cannot be removed again, or at least not without tools, but may also not be removable in a non-destructive manner. In an alternative configuration, a reversible arrangement on the adapter is possible so that the hand tool can be equipped with the one or the other slide-on or snap-on part, if required.

The ranges or value ranges or multiple ranges specified above and below also include disclosure of all intermediate values, in particular in steps of $1/10$ of the respective dimension, optionally also dimensionless. For example, the detail $1/10$ to $2/3$ also includes disclosure from $11/100$ to $2/3$, $1/10$ to $19/30$, $11/100$ to $19/30$, etc. This disclosure can serve, on the one hand, as a specified range limit from below and/or above, alternatively, however, for disclosing one or more singular values from a respectively specified range.

BRIEF DESCRIPTION OF THE DRAWINGS

The invention is explained below with reference to the accompanying drawings, which, however, only illustrates exemplary embodiments. A part that is explained only with reference to one of the exemplary embodiments, and in a further exemplary embodiment is not replaced by another part due to the special feature emphasized therein, is therefore also described for this further exemplary embodiment as a part which in any case is potentially present. In the figures:

FIG. 2 shows a perspective illustration of a handle sleeve with a functional part arranged thereon;

FIG. 3 shows a perspective detail illustration of a handle sleeve with an associated functional part not yet attached to the functional part;

FIG. 4 shows the functional part of the first embodiment in a perspective individual illustration;

FIG. 5 shows the section according to line V-V in FIG. 2;

FIG. 7 shows the functional part in a bottom view;

FIG. 8 shows the sections according to the line VIII-VIII in FIG. 5;

FIG. 9 shows a sectional view corresponding to FIG. 5, regarding a pivoting position of a bracket pivotably held on the functional part;

FIG. 10 shows a sectional view through a functional part in a second embodiment;

FIG. 11 shows a sectional view corresponding to FIG. 10, regarding a third embodiment of the functional part;

FIG. 12 shows a fourth embodiment of the functional part in a sectional view according to FIG. 10;

FIG. 13 shows an illustration corresponding to FIG. 6, regarding another embodiment;

FIG. 14 shows the bottom view of FIG. 13;

FIG. 15 shows the embodiment according to FIG. 13 in a sectional view according to FIG. 9;

FIG. 16 shows another sectional view corresponding to FIG. 9, regarding another embodiment.

DESCRIPTION OF THE EMBODIMENTS

Figure 1:
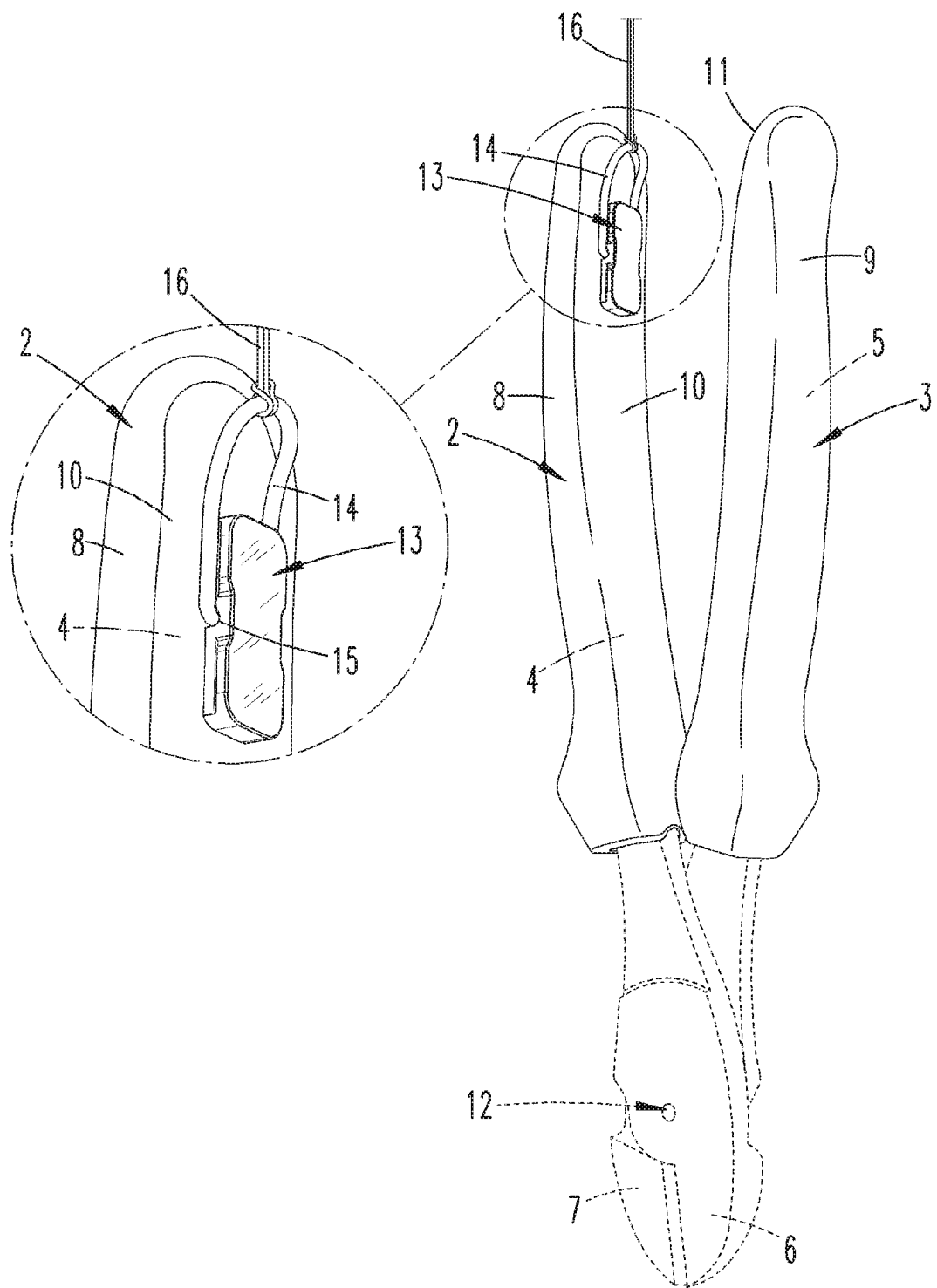
FIG. 1 shows in perspective illustration a hand tool in the form of pliers with a functional part arranged on a handle sleeve of the hand tool in a first embodiment, as well as an enlargement of the attached functional part.
Figure 6:
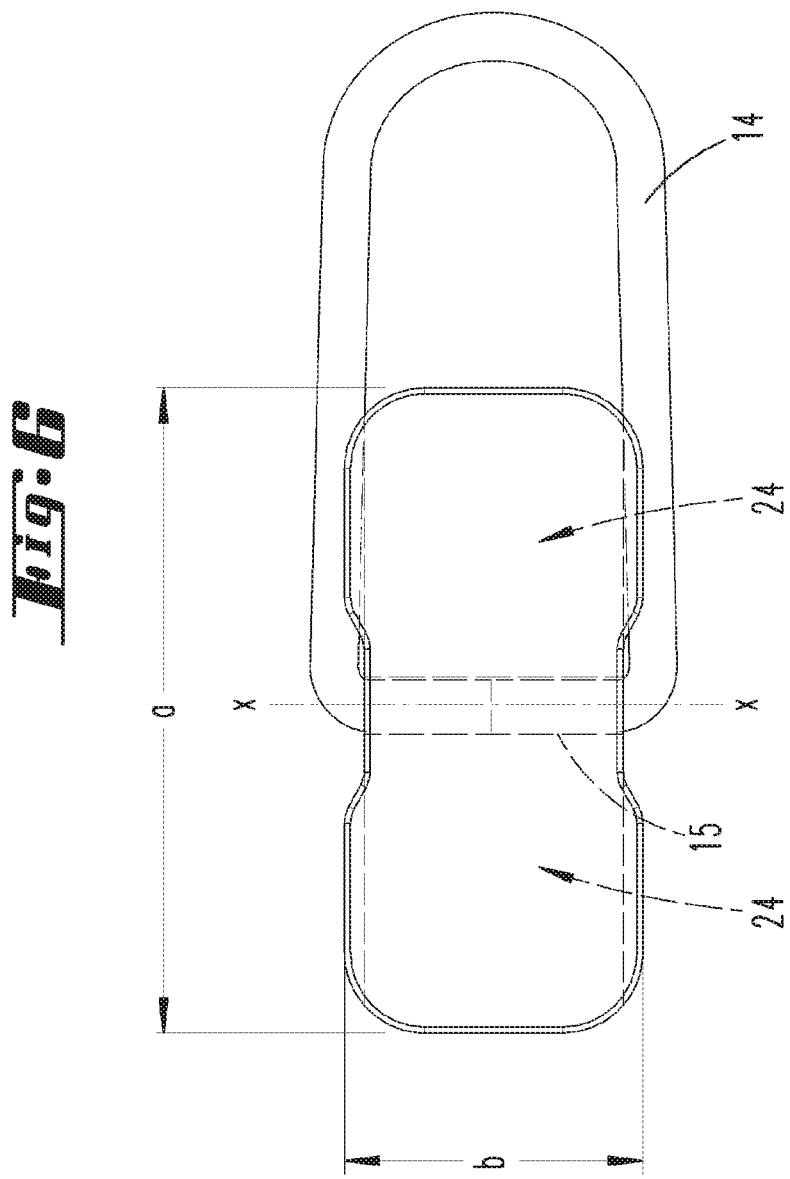
FIG. 6 shows the functional part of the first embodiment in a top view.

Illustrated and described, in first instance with reference to FIG. 1, is a hand tool 1 in the form of pliers, further in particular in the form of a side cutter. However, the following explanations do not only refer to such hand tools, but in particular also to other pliers, such as flat pliers, water pump pliers, combination pliers or the like, furthermore also to scissors, such as household or garden shears, for example.

The hand tool 1 has two tool halves 2, 3 arranged crossing in a joint region. Here, each tool half 2, 3 forms a handle region 4, 5, which transitions into a working region 6, 7 beyond the crossing and joint region of the tool halves 2, 3. The working regions 6 and 7 form cutting edges in the exemplary embodiment of a hand tool 1 illustrated in FIG. 1.

The handle region 4 and the working region 6 form the tool half 2; the handle region 5 and working region 7 form the tool half 3.

Preferably, each handle region 4, 5 is encompassed by a handle sleeve 8, 9. Preferably, the latter can be a sleeve made of a plastic material which optionally can be molded directly onto the tool half 2, 3 using the injection molding process. Known solutions provide here for the separate production of handle sleeves 8, 9 using the plastic injection molding process, optionally using the two-component plastic injection molding process. The handle sleeves 8, 9 are pushed onto the handle regions 4, 5. There may also be such handle sleeves 8, 9, which are molded directly onto the handle regions 4, 5 using the dipping process.

In particular, the inner surfaces 10, 11 of the handle sleeves 8, 9 which face each other are preferably formed to be flat starting from the free ends of the handle regions 4, 5 in the direction of the joint 12, further in particular in a first quarter or first third of the entire longitudinal extent of the handle sleeves 8, 9, starting from the free end of the handle regions 4, 5.

Such a flat surface can also arise on the outside of each limb, further e.g. also in the region of the end faces at the handle end.

In any case, the flat partial region of the inner surfaces 10, 11 is suitable for the arrangement of a functional part 13 present separately in first instance.

Preferably, the functional part 13 can be a separately produced plastic injection-molded part. The plastic material may be selected such that it is different in terms of hardness and/or coloring from the plastic material in the region of the of the handle sleeve 8, 9, which flat surface provides for the fixing zone.

For arrangement on the handle sleeve 8, 9, the functional part 13 can be adhered or welded thereto, wherein thermoplastics are present in the fixing region with regard to both the functional part 13 and the handle sleeve 8, 9 in the case of a preferred ultrasonic welding.

The functional part 13 illustrated in FIGS. 1 to 9 is a bracket holder, correspondingly comprising a wire bracket 14 which is pivotable about an axis x and bent accordingly. The bracket limbs forming the geometric pivot axis x extend in a groove 15 provided in the functional part 13. In an associated position, the groove is open when facing the surface of the handle sleeve 8 or 9, so that the wire bracket 14 is caught between the handle sleeve 8 or 9 and the functional part 13.

The free ends of the bent wire bracket 14 preferably abut against each other within the groove 15 (see FIG. 8). The wire bracket 14 can also be retrofitted to the functional part 13 fixed to the handle sleeve 8 or 9 by bending the respective free ends. Due to the separate configuration of the functional part 13 and the open groove 15, a wire bracket 14 circumferentially configured in a virtually endless manner, e.g. with ends welded together, can also be used. Such a wire bracket 14 is inserted into the groove 15 before fixing the functional part 13 to the handle sleeve 8, 9.

The wire bracket 14 can be used, for example, in conjunction with a cord or the like to prevent the hand tool 1 from dropping, further, for example, by tying the hand tool 1 to a belt or the like.

The cord 16 can be knotted-in e.g. by means of a cow hitch.

The selected fixing (adhesive bonding or welding) is preferably designed for non-destructive absorption of forces up to 300 or 500 Newton.

The wire bracket 14, preferably made of a stainless spring steel wire, can be substantially stationary in an orientation extending substantially in extension of the functional part 13, as illustrated in FIGS. 1 to 8. A pivoting displacement of the wire bracket 14 from this position around the pivoting axis x preferably takes place only after exceeding an overload provided by the design, e.g. after pivoting the wire bracket 14 out of the basic position by about 15 to 30° (cf. FIG. 9).

As further shown in FIG. 9 in dotdashed illustration, it is also possible in one embodiment to hold the wire bracket 14 in a latched manner in a direction substantially perpendicular to the orientation of the functional part 13 and thus preferably also perpendicular to the facing surface of the inner surfaces 10, 11 of the handle sleeve 8, 9.

Illustrated in each case is the arrangement of a functional part 13 on an inner surface 10 or 11 of the handle sleeve 8, 9. Arranging several functional parts 13, e.g. two function parts 13, on both handle sleeves 8, 9 is also possible.

As can be seen from the illustration in FIG. 10, the functional part 13 can also be a spring 17. For this purpose, the functional part 13 in the exemplary embodiment is formed comprising an elastic portion approximately circular (e.g. produced using the two-component injection molding process). The one half of the tool 2 is supported on the other half of the tool 3 via the spring 17. The spring 17 supports the automatic return of the hand tool 1 into a preferred basic position.

The functional part 13 can also form an adapter 18 on which a slide-on part 19 (optionally a snap-on part) can be attached. The adapter 18 can be provided with different slide-on parts 19, thus, for example, with a spring part 20, as illustrated (cf. FIG. 11).

Also, according to the illustration in FIG. 12, the functional part 13 can be a spring receptacle 21 for holding a leaf spring 22 acting on the other half of the tool. A free end of the leaf spring 22 can be held in a slotted receptacle of the spring reseptacle 21, in particular held in a latched manner.

The functional part 13 has a connection region 24 formed for connection to the handle sleeve 8 or 9.

This connection region 24 can be formed to be flat, e.g. to provide an adhesive surface.

For ultrasonic welding, as preferred, the connection region 24, in particular the connection surface facing the surface of the handle sleeve 8, 9, can be structured in a ribor nub-like manner. Illustrated is a rib-like structuring with ribs 25, which are circumferentially closed and run concentrical to a central axis running substantially perpendicular to the connection plane E. In the exemplary embodiment illustrated, three ribs 25 that are circumferentially closed and arranged concentrically are formed in a connection region 24.

As further illustrated, two connection regions 24 arranged one behind the other in the longitudinal direction of the handle sleeve 8, 9 may be provided, which are separated by the groove 15 in a configuration of the functional part 13 as a bracket holder according to the illustrations in FIGS. 1 to 9. In the exemplary embodiment shown, there are two approximately square connection regions 24 each with three concentrically extending circumferential ribs 25.

In the case of functional parts 13, the connection surface of which is not interrupted by a groove or the like, there may also be only one connection region, e.g. an elongated rectangular connection region.

Overall, in particular in the case of the functional part 13 of the first embodiment, the result is an elongated, cuboid shape with a length a, viewed in the longitudinal extent of the handle sleeve 8, 9, which corresponds approximately to 1.5 to 3 times, preferably approximately 2 times the width b of the functional part 13.

The thickness c of functional part 13, as viewed perpendicular to the connection plane E, corresponds to approximately one third to two thirds, e.g. approximately half of the given thickness d of the handle region 4, 5 which otherwise is enclosed by the handle sleeve 8, 9, in the region of the functional part 13.

FIGS. 13 to 16 show embodiments in which a technical part 28, in particular an electronic technical part, such as e.g. a transponder 26, in particular an RFID transponder, is arranged on the handle region or on the handle sleeve using the functional part 13.

The transponder 26 may be enclosed by the material, in particular plastic material, of the functional part 13 (cf. FIG. 16).

Such a hidden position of the transponder 26 can be given with a configuration according to FIGS. 13 to 15, in which a recess 27 is provided in a connection region 24, which recess is open towards the connection plane E and otherwise is closed all around, and into which the transponder 26 can be inserted. After fixing the functional part 13, the transponder 26 is caught between the functional part 13 and the handle.

Such a technical part 28 can also be, for example, a voltage tester or a rechargeable accumulator for operating an electrical or electronic element.

The above explanations serve to explain the inventions covered by the present application as a whole, which, at least through the following feature combinations, in each case also independently, further refine the prior art, namely:

A hand tool, which is characterized in that the functional part 13 is adhered or welded to the first and/or second handle sleeve 8, 9.

A hand tool, which characterized in that the functional part 13 is arranged on the inner surface 10, 11 of the first and/or second handle 8, 9 facing the inner surface 10, 11 of the opposite second and/or first handle sleeve 8, 9.

A hand tool, which characterized in that the functional part 13 has a connection region 24 which is formed for connection to the first and/or second handle sleeve 8, 9 and which is formed as a flat surface or structured in a rib- or nub-like manner.

A hand tool, which is characterized in that in the case of a rib-like structure, at least one circumferentially closed rib 25 is formed.

A hand tool, which characterized in that two connection regions 24 separated in the longitudinal direction of a handle sleeve 8, 9 are formed.

A hand tool, which is characterized in that the functional part 13 overall has an elongated, cuboid shape.

A hand tool, which is characterized in that the functional part 13 has a thickness c which protrudes beyond the plane surface of the surface and corresponds to $1/10$ to $2/3$ of the thickness dimension of the handle region 4, 5, which otherwise is enclosed by the handle sleeve 8, 9, in the region of the functional part 13.

A hand tool, which is characterized in that the functional part 13 is formed as a drop protection, is a spring 17 or a spring receptacle 21 or a bracket holder, an adapter 18 for a slide-on or snap-on part 19 or a receptacle or holder for a technical part 28.

A hand tool, which is characterized in that the technical part 28 is an RFID transponder 26.

A hand tool, which is characterized in that the technical part 28 is a voltage tester.

All features disclosed (in themselves but also in combination among each other) are pertinent for the invention. The disclosure content of the associated/accompanying priority documents (copy of the prior application) is also hereby included in full in the disclosure, including for the purpose of incorporating features of these documents in claims of the present application. The subsidiary claims with their features characterize independent inventive refinements of the prior art, in particular to undertake divisional applications based on these claims.

REFERENCE LIST

1 Hand tool
2 Tool half
3 Tool half
4 Handle region
5 Handle region
6 Working region
7 Working region
8 Handle sleeve
9 Handle sleeve
10 Inner surface
11 Inner surface
12 Joint
13 Functional part
14 Wire bracket
15 Groove
16 Cord
17 Spring
18 Adapter
19 Slip-on part
20 Spring part
21 Spring receptacle
22 Leaf spring
23 Slotted receptacle
24 Connection region
25 Rib
26 Transponder
27 Recess
28 Technical part E Connection plane
a Length
b Width
c Thickness
x Pivot axis

The invention claimed is:

1. A hand tool (1), comprising two tool halves (2, 3) arranged crossing one another in a joint region, wherein each tool half (2, 3) forms a working region (6, 7) on one side of the joint region and a handle region (4, 5) on another side, wherein further each handle region (4, 5) is arranged in a first or second handle sleeve (8, 9) and the handle sleeve (8, 9) is provided with a functional part (13) projecting in relation to a flat surface extending over a substantial portion of the surface of the handle sleeve (8, 9), and wherein the functional part (13) is adhered or welded to the first and/or second handle sleeve (8, 9).

2. The hand tool according to claim 1, wherein the functional part (13) is arranged on the inner surface (10, 11) of the first and/or second handle (8, 9) facing the inner surface (10, 11) of the opposite second and/or first handle sleeve (8, 9).

3. The hand tool according to claim 1, wherein the functional part (13) has a connection region (24) which is formed for connection to the first and/or second handle sleeve (8, 9) and which is formed as a flat surface or structured in a rib- or nub-like manner.

4. The hand tool according to claim 3, wherein in the case of a rib-like structure, at least one circumferentially closed rib (25) is formed.

5. The hand tool according to claim 1, wherein two connection regions (24) separated in the longitudinal direction of a handle sleeve (8, 9) are formed.

6. The hand tool according to claim 1, wherein the functional part (13) overall has an elongated, cuboid shape.

7. The hand tool according to claim 1, wherein the functional part (13) has a thickness (c) which protrudes beyond the plane surface of the surface and corresponds to $\frac{1}{10}$ to $\frac{2}{3}$ of the thickness dimension of the handle region (4, 5), which otherwise is enclosed by the handle sleeve (8, 9), in the region of the functional part (13).

8. The hand tool according to claim 1, wherein the functional part (13) is formed as a drop protection, is a spring (17) or a spring receptacle (21) or a bracket holder, an adapter (18) for a slide-on or snap-on part (19) or a receptacle or holder for a technical part (28).

9. The hand tool according to claim 8, wherein the technical part (28) is an RFID transponder (26).

10. The hand tool according to claim 8, wherein the technical part (28) is a voltage tester.

* * * * *

UNITED STATES PATENT AND TRADEMARK OFFICE
CERTIFICATE OF CORRECTION

PATENT NO. : 10,807,228 B2
APPLICATION NO. : 16/073841
DATED : October 20, 2020
INVENTOR(S) : Schleiminger It is certified that error appears in the above-identified patent and that said Letters Patent is hereby corrected as shown below:

On the Title Page

Column 1, item [73], please change:
"KNIPEX-Werk C. Gustave Putsch KG, Wuppertal (DE)"
To correctly read:
-- KNIPEX-Werk C. Gustav Putsch KG, Wuppertal (DE) --.

Signed and Sealed this
Ninth Day of April, 2024

Katherine Kelly Vidal
*Director of the United States Patent and Trademark Office*